United States Patent
Wu et al.

(10) Patent No.: US 8,455,999 B2
(45) Date of Patent: Jun. 4, 2013

(54) METHOD FOR REDUCING CHIP WARPAGE

(75) Inventors: Ting-Hau Wu, Yilan (TW); Chun-Ren Cheng, Hsin-Chu (TW); Jiou-Kang Lee, Zhu-Bei (TW); Shang-Ying Tsai, Jhongli (TW); Jung-Huei Peng, Jhubei (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 13/240,540

(22) Filed: Sep. 22, 2011

(65) Prior Publication Data

US 2012/0007220 A1    Jan. 12, 2012

Related U.S. Application Data

(63) Continuation of application No. 12/610,873, filed on Nov. 2, 2009, now Pat. No. 8,053,336.

(60) Provisional application No. 61/113,872, filed on Nov. 12, 2008.

(51) Int. Cl.
*H01L 23/34* (2006.01)

(52) U.S. Cl.
USPC .......................................... 257/723; 257/684

(58) Field of Classification Search
USPC .................. 257/773–778, 723–726, 678, 684
See application file for complete search history.

(56) References Cited

U.S. PATENT DOCUMENTS

| | | | |
|---|---|---|---|
| 5,650,881 | A | 7/1997 | Hornbeck |
| 6,568,794 | B2 | 5/2003 | Yamanaka et al. |
| 7,167,298 | B2 | 1/2007 | Pan |
| 7,307,777 | B2 | 12/2007 | Pan |
| 2005/0146404 | A1* | 7/2005 | Yeatman .................. 335/78 |
| 2006/0022263 | A1* | 2/2006 | Haase et al. ............. 257/328 |
| 2009/0146312 | A1* | 6/2009 | Sulfridge ................. 257/774 |
| 2010/0032767 | A1 | 2/2010 | Chapman et al. |

FOREIGN PATENT DOCUMENTS

SU    523905 A    10/1976

OTHER PUBLICATIONS

Dang et al., "Wafer-Level Microfluidic Cooling Interconnects for GSI", Interconnect Technology Conference, 2005, Proceedings of the IEEE 2005 International, pp. 180-182, 2005.*

* cited by examiner

*Primary Examiner* — Richard Booth
(74) *Attorney, Agent, or Firm* — Slater & Matsil, L.L.P.

(57) ABSTRACT

A method of forming an integrated circuit structure including providing a wafer comprising a front surface and a back surface, wherein the wafer comprises a chip; forming an opening extending from the back surface into the chip; filling an organic material in the opening, wherein substantially no portion of the organic material is outside of the opening and on the back surface of the wafer; and baking the organic material to cause a contraction of the organic material.

20 Claims, 10 Drawing Sheets

METHOD FOR REDUCING CHIP WARPAGE

This application is a continuation of U.S. patent application Ser. No. 12/610,873, filed Nov. 2, 2009, and entitled "Method for Reducing Chip Warpage," which application claims priority to U.S. Provisional Application No. 61/113,872, filed Nov. 12, 2008, and entitled, "Flat Plane Wafer Control Method by MEMS Process," which applications are hereby incorporated herein by reference.

TECHNICAL FIELD

This invention relates to integrated circuits generally and more particularly to methods and structures for reducing the warpage of wafers and chips.

BACKGROUND

As is well known in the art, most integrated circuits are manufactured on wafers, typically semiconductor wafers, and more typically silicon wafers. Over the past decades, wafers have grown from a mere two inches in diameter to eight inches in diameter and, more recently, to twelve inches in diameter, also known as 300 mm wafers. While some devices manufactured today are manufactured on eight-inch wafers, most new integrated device manufacturing facilities will be designed to manufacture on twelve-inch wafers.

As the area of a circle is related to the square of its diameter, a fifty percent increase in the diameter (as in moving from an eight-inch wafer to a twelve-inch wafer) results in more than double the available surface area for manufacturing devices.

Another trend in integrated circuit device manufacturing relates to packaging technology. With the move toward surface mount technology and so called low profile packages, wafers are being ground to increasingly lesser thicknesses as part of the packaging process.

As wafers become larger in diameter and thinner in thickness, previously unknown or at least unappreciated forces play an increasingly important role. These forces include the compressive or tensile stress applied to the wafer, and to the chips in the wafer, by the thin films that are formed thereon as part of the integrated circuit manufacturing processes.

The combination of a greater number of thin films applying stress to thinner wafers/chips results in significant warpage of the wafer/chip and of the subsequently formed integrated circuits. (As is known, the wafers are diced into individual chips that, when packaged, form complete integrated circuit devices.)

The warpage has several deleterious effects. One of the negative effects is that the warpage of chips or wafers can significantly impact the electrical performance of the devices formed in the chips/wafers. As is known, strain in the semiconductor layer in which MOS transistors are formed can significantly impact charge carrier mobility. The strain caused by warpage of chips/wafers can adversely impact charge carrier mobility.

Conventionally, the warpage problem of wafers/chips were solved by coating a film on the front surface or the back surface of the wafer, with the film having an inherent stress, which causes the wafer to warp against the existing warpage direction, hence compensating for the existing warpage. A flat wafer may thus be formed. After the dicing process, the resulting chips are also flat. However, not all of the wafers can be fixed using such a method. For example, micro-electromechanical system (MEMS) devices need to be exposed to the external environment out of the resulting chips, for the purpose of, for example, sensing acoustic wave (in MEMS microphones), or allowing the flow of fluid (in micro inkjet heads or bio flow pumps). Such chips cannot be coated with films.

What is needed, therefore, is a method and structure for overcoming the above-described shortcomings in the prior art.

SUMMARY OF THE INVENTION

In accordance with one aspect of the present invention, an integrated circuit structure includes a discrete chip, which includes a back surface; an opening extending from the back surface into the discrete chip; and an organic material in the opening. The organic material either partially or fully fills the opening. The organic material may include photo resist.

In accordance with another aspect of the present invention, an integrated circuit structure includes a chip. The chip includes a front surface; and a back surface on an opposite side of the chip as the front surface. A plurality of trenches is in the chip and extends from the back surface into the chip. A photo resist fills the plurality of trenches, wherein substantially no photo resist is outside of the plurality of trenches and on the back surface of the chip.

In accordance with yet another aspect of the present invention, a method of forming an integrated circuit structure includes providing a wafer having a front surface and a back surface, wherein the wafer includes a chip; forming an opening extending from the back surface into the chip; and filling an organic material in the opening. Substantially no portion of the organic material is outside of the opening and on the back surface of the wafer. The organic material is baked to cause a contraction of the organic material.

In accordance with yet another aspect of the present invention, a method for forming an integrated circuit structure includes providing a wafer having a front surface and a back surface. The wafer includes a chip. The method further includes forming a plurality of trenches extending from the back surface into the chip; filling a first photo resist in the plurality of trenches; removing portions of the first photo resist outside the plurality of trenches; and baking the first photo resist.

The advantageous features of the embodiments include the ability for reducing and substantially eliminating the warpage of semiconductor chips, and the flexibility of applying the embodiments of the present invention to structures that cannot be applied with stressed coatings.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION OF ILLUSTRATIVE EMBODIMENTS

The making and using of the embodiments are discussed in detail below. It should be appreciated, however, that the embodiments provide many applicable inventive concepts that can be embodied in a wide variety of specific contexts. The specific embodiments discussed are merely illustrative of specific ways to make and use the invention, and do not limit the scope of the invention.

A novel semiconductor chip having stress-compensation trenches and a method of forming the same are presented. The intermediate stages of manufacturing an embodiment are illustrated. The variations of the embodiment are discussed. Throughout the various views and illustrative embodiments, like reference numbers are used to designate like elements. Throughout the description, when a wafer is placed with the front surface up, and the warpage causes the edges of the wafer to be higher than the center of the wafer, the warpage is referred to as having a positive value, and is referred to as a positive warpage. Conversely, if the edges are lower than the center of the wafer, the warpage is referred to as having a negative value, and is referred to as a negative warpage. Further, if the absolute value of the warpage increases, the warpage is referred to as being "increased" regardless of whether the warpage is positive or negative.

Figure 1:
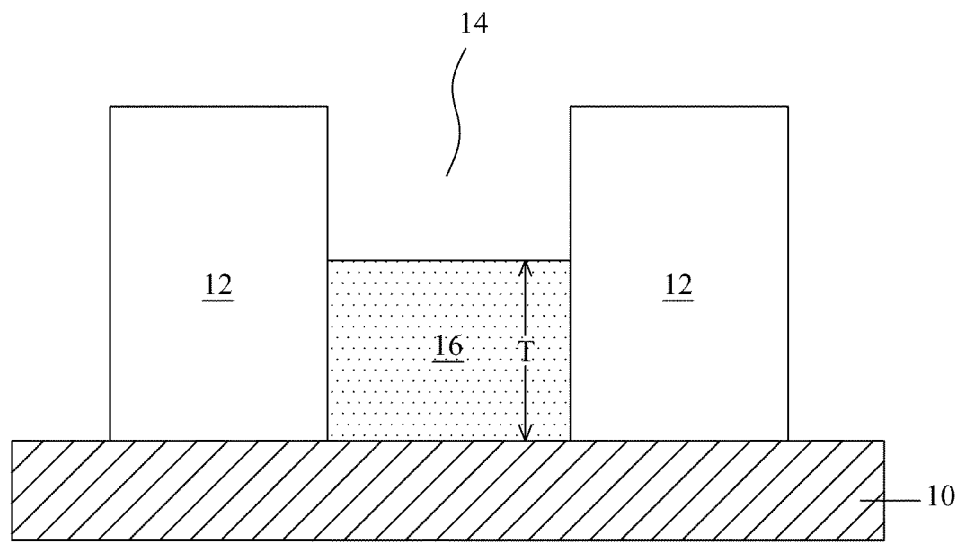
FIGS. 1 and 2 illustrate the effect of filling a photo resist into a spacing between two neighboring structures, and baking the photo resist.
Figure 2:
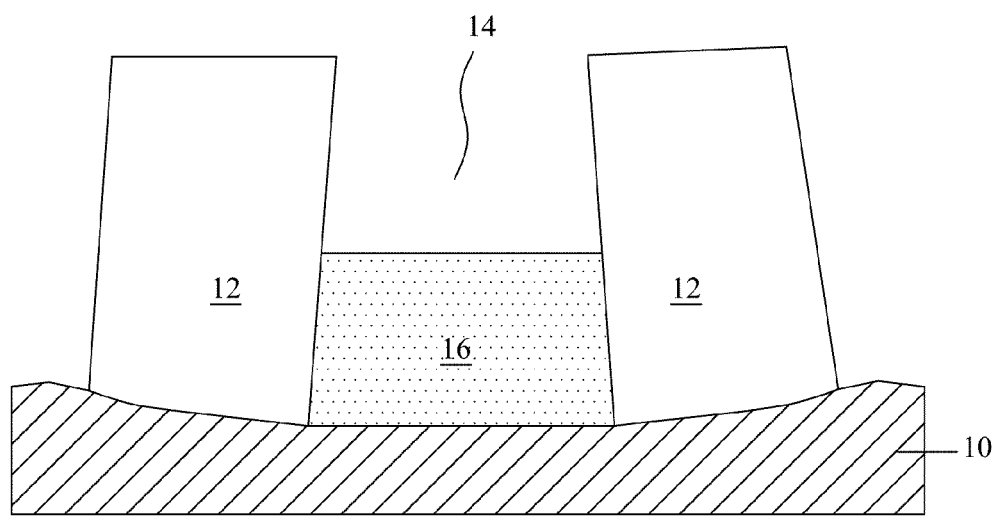

FIGS. 1 and 2 schematically illustrate cross-sectional views of a structure on which the inventors of the present invention performed an experiment. Referring to FIG. 1, structures 12 are formed on substrate 10. Structures 12 may be part of substrate 10, and may be formed by etching substrate 10, so that structures 12 stand above the surrounding substrate materials. Alternatively, structures 12 may be the features formed on the surface of substrate 10. Space 14 exists between neighboring structures 12. Photo resist 16 is filled into space 14, and then baked. As a result of the baking, photo resist 16 contracts, and hence applies a compressive force to structures 12. Accordingly, warpage occurs in substrate 10, as is shown in FIG. 2. For illustration purposes, the warpage is exaggerated.

Figure 3:
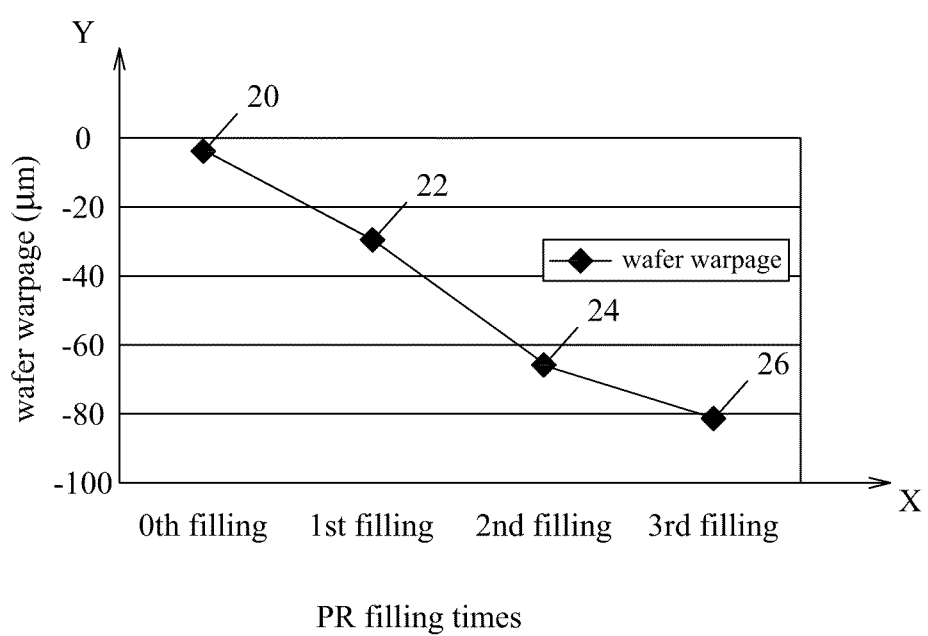
FIG. 3 illustrates the wafer warpage as a function of the amount of photo resist filled into the trenches of a wafer.

In a further experiment, a substantially flat wafer (not shown) is provided, and trenches are formed on the back surface of the wafer, wherein in each of the chips in the wafer, the trenches form concentric rings, with each of the rings having the center of the chip as its center. A plurality of photo-resist filling and baking processes are then performed, wherein the photo resist is filled into the trenches and stacked on the photo resist filled in the preceding photo-resist filling process. Therefore, each of the photo-resist filling processes causes the thickness of the photo resist in the trenches to be increased. The result is shown in FIG. 3, wherein the X-axis indicates the number of photo-resist fillings, while the Y-axis indicates the wafer warpage, wherein the meaning of the wafer warpage may be referred to as warpage WAP1 in FIG. 4B. Point 20 in FIG. 3 indicates the initial warpage of the wafer with trenches having a depth of 30 μm formed, but no photo resist filled therein.

In the experiment, when no photo resist is filled into trenches ($0^{th}$ filling), the wafer has a warpage of about −5 μm. The trenches are first filled with a first layer of photo resist, wherein the first layer of photo resist has a thickness T of 10 μm in the trenches (refer to FIG. 1). The wafer is then baked. It was found that after the baking, the warpage of the wafer increases to about −30 μm, as indicated by point 22. Next, a second layer of photo resist, which also has a thickness of 10 μm, is filled into the trench and over the first layer of photo resist. A second baking is then performed. As a result of the second baking, the warpage of the wafer increases to about −65 μm, as indicated by point 24. Next, a third layer of photo resist, which also has a thickness of 10 μm, is filled into the trench and over the second layer of photo resist. A third baking is then performed. Again, the warpage increases to about −82 μm, as indicated by point 26.

The results shown in FIG. 3 revealed that by forming trenches on the backside of a wafer, filling photo resists in the trenches and baking the photo resists, negative warpage may result. Further, the magnitude of the negative warpage increases with the increase in the thickness of the photo resist. Accordingly, if a wafer or a chip has a positive warpage, by using the method as shown in FIGS. 1 through 3, the positive warpage can be compensated for. The warpage of the resulting wafer can be at least reduced, and possibly substantially eliminated if appropriate amounts of photo resist are used. With the wafer being substantially flat, the resulting chips, after they are sawed from the wafer, will also be flat.

Figure 4A:
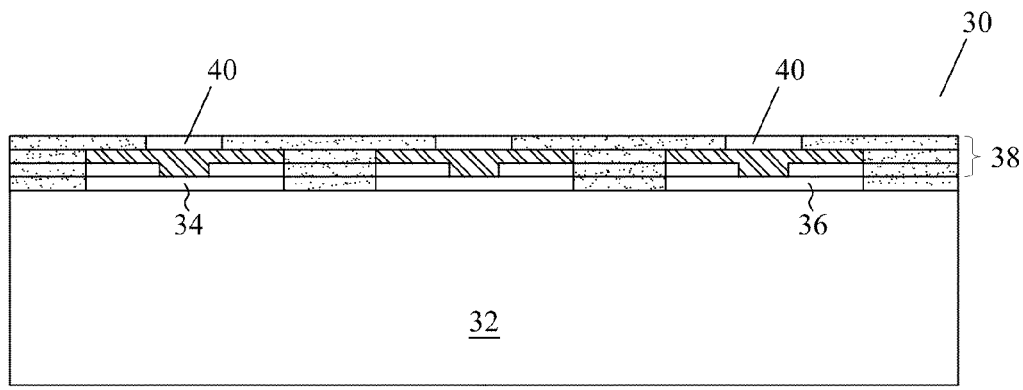
FIGS. 4A through 8B are top views and cross-sectional views of intermediate stages in the manufacturing of an embodiment of the present invention.
Figure 4B:
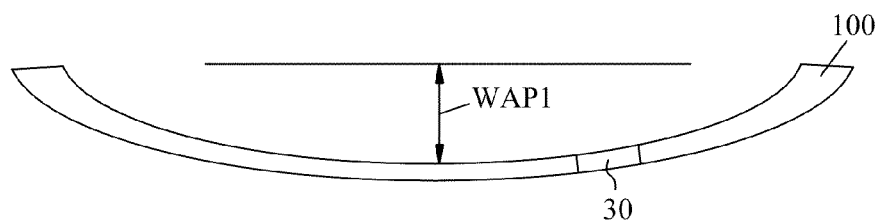

FIG. 4A through FIG. 8B illustrate cross-sectionals views and top views of intermediate stages in an embodiment. Referring to FIG. 4A, chip 30 is formed. Chip 30 is a portion of wafer 100, which is schematically illustrated in FIG. 4B, wherein chip 30 may be any of the chips in wafer 100. Further, all chips in wafer 100 will have an identical structure as chip 30, and will go through the same process as shown in FIGS. 5A through 8A. Chip 30 may include semiconductor substrate 32, which may comprise silicon, germanium, GaAs, or other commonly used semiconductor materials. Also, semiconductor substrate 32 may be a bulk substrate, or have a semiconductor-on-insulator structure. Devices 34 and 36, which are symbolized by blocks, are formed at the front surface (the surface facing up in FIG. 4A) of substrate 32. In an embodiment, devices 34 include complementary metal-oxide-semiconductor (CMOS) devices, bipolar junction transistors, capacitors, transistors, and/or the like. Devices 36 may be MEMS devices, which may include MEMS microphones, micro flow pumps, micro inkjet heads, or the like. Chip 30 further includes interconnect structure 38 on the front surface, wherein interconnect structure 38 may include metal lines and vias (not shown). Further, bond pads 40 may be formed on the front surface of chip 30. Referring again to FIG. 4A, wafer 100 has warpage WAP1, which is a positive warpage. Again, for illustration purposes, the warpage of wafer 100 may be exaggerated throughout the drawings.

Figure 5A:
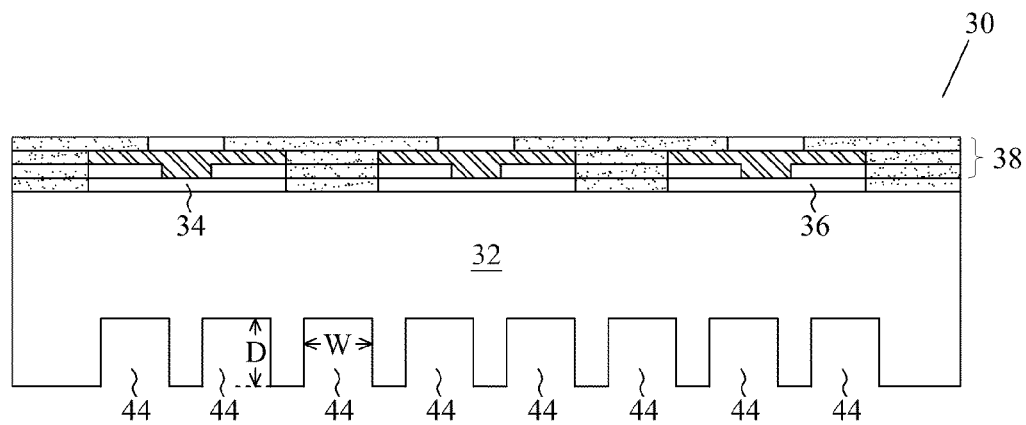

As shown in FIG. 5A, trenches 44 are formed on the backside of chip 30, and may be either in substrate 32, or in the layer(s) formed on the back surface of substrate 32, which layer(s) include, but are not limited to, semiconductor layers, dielectric layers, metallic layers, polysilicon layers, and combinations thereof. It is noted that the term "trench" refers to openings whose lengths and widths are different, and also to openings whose lengths and widths are substantially the same. Trenches 44 may be formed by etching or laser drilling, or any other applicable method. Trenches 44 stop at an intermediate level between the back surface and the front surface, which is opposite to the back surface, of substrate 32. Alternatively stated, depth D of trenches 44 is smaller than the thickness of substrate 32. FIGS. 5B through 5F illustrate possible bottom views of chip 30 as illustrated in FIG. 5A. Please note that any trench or opening formed on the backside of chip 30, after the photo resist filled therein is baked, has the effect of inducing positive warpage. Therefore, trenches 44 may have any other pattern besides what are illustrated and/or discussed, and the patterns shown in FIGS. 5B through 5F are merely examples, and should not limit the scope of the present invention.

Figure 5B:
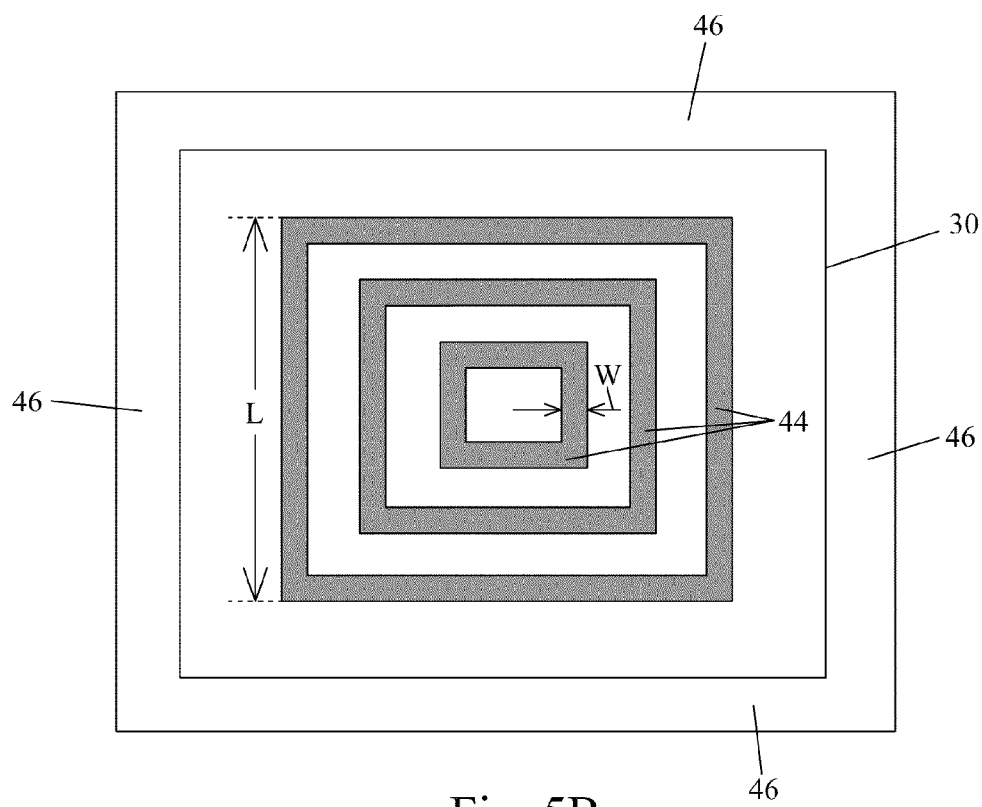
Figure 5C:
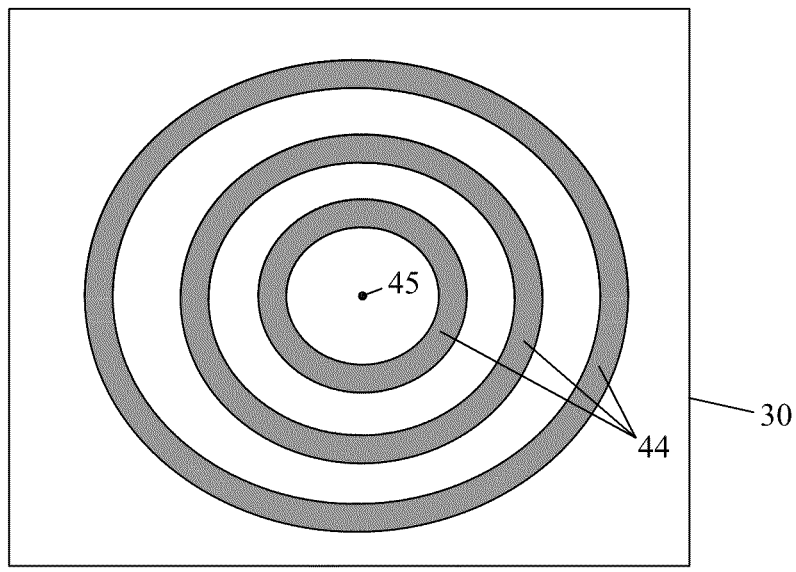
Figure 5D:
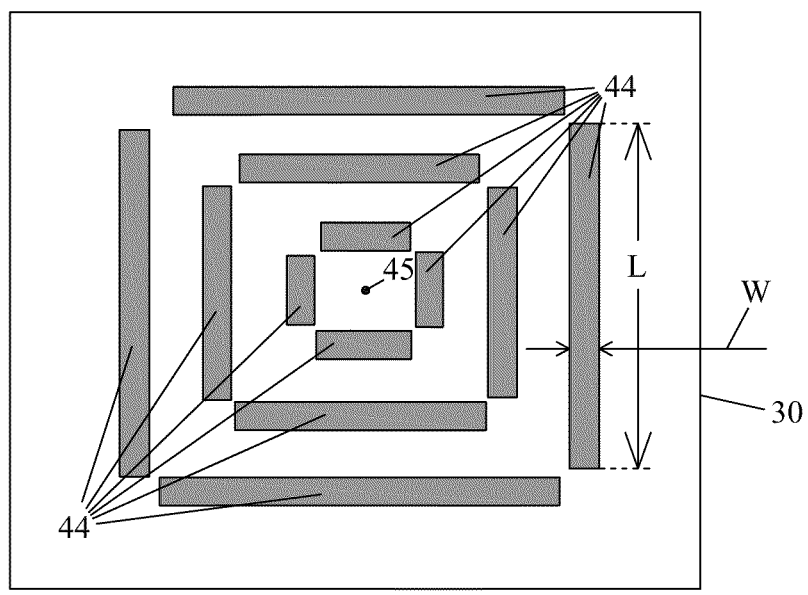

In FIG. 5B, trenches 44 form concentric rings, with each of the rings being a square. In an embodiment, each trench 44 is limited in the range of the respective chip 30, and does not extend into scribe lines 46 that surround chip 30, although trenches 44 may also extend into scribe lines 46. Each of the chips 30 in wafer 100 thus will have its own trenches 44. FIG. 5C illustrates an alternative embodiment, wherein trenches 44 form concentric circles.

Figure 5E:
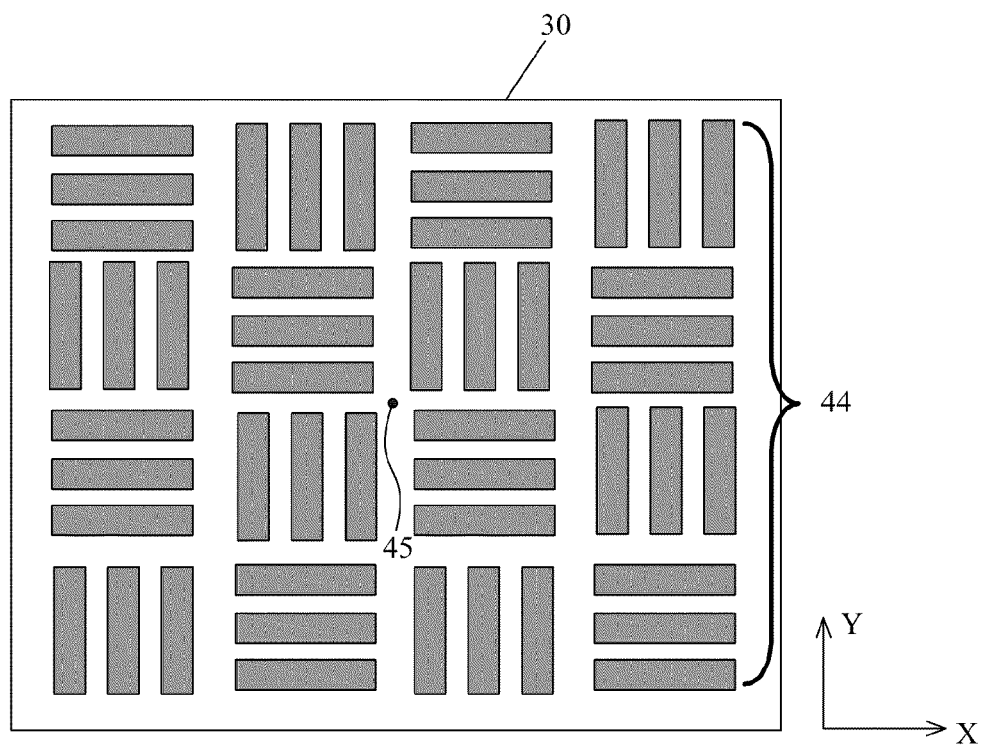
Figure 5F:
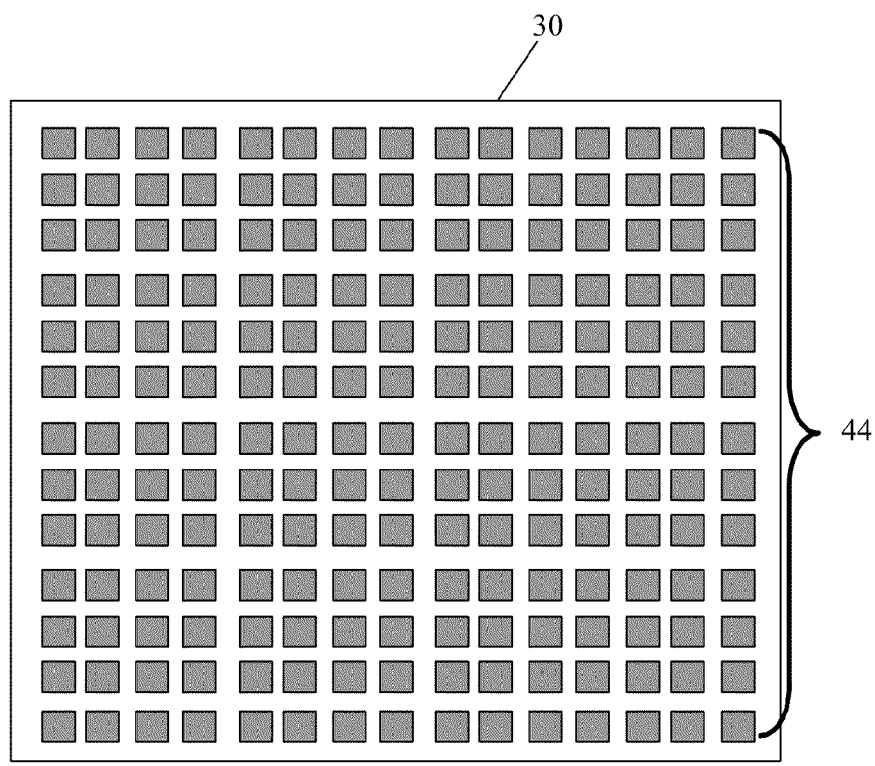

In alternative embodiments, trenches 44 do not form closed-loop patterns. For example, in FIG. 5D, trenches 44 do not connect to each other. In FIG. 5E, trenches 44 are allocated either parallel to the X-axis direction, or parallel to the Y-axis direction, wherein both the X-axis direction and the Y-axis direction are parallel to the front surface and the back surface of substrate 32 (not shown in FIG. 5E, please refer to FIG. 5A), and are referred to as in-plane directions. However, in each small region, trenches 44 may be parallel to each other, and perpendicular to the trenches 44 in neighboring regions. In FIG. 5F, trenches 44 are actually in the form of deep holes, whose lengths and widths are substantially the same. Deep holes 44 may be arranged in the form of a matrix, beehives, or any other form. Each of the deep holes may have the shape of rectangles or circles. In the embodiments of the present invention, trenches 44 may have a symmetric pattern that is either symmetric to center 45 of chip 30, or symmetric to the X-axis and Y-axis of the chip, wherein the X-axis is parallel to one side of chip 30, while the Y-axis is parallel to another side of chip 30 and is perpendicular to the X-axis. More preferably, trenches 44 are symmetric to the center 45 of chip 30, the X-axis, and the Y-axis of chip 30, so that the resulting stress applied by trenches 44 is also symmetric.

The optimum density, width W and depth D (refer to FIG. 5A), and length L (refer to FIGS. 5B and 5E) of trenches 44 depend on the warpage to be compensated for, and may be found through experiments. A greater density of trenches 44 will result in a greater warpage compensation effect in the direction perpendicular to the lengthwise direction of the trenches. In an exemplary embodiment, width W is between about 5 µm and 10 µm. Depth D is less than about 150 µm, and may even be less than about 50 µm. It is realized, however, that the dimensions recited throughout the description are merely examples, and may be changed if different formation technologies are used, or if experiments reveal that different dimensions are preferred.

Figure 6A:
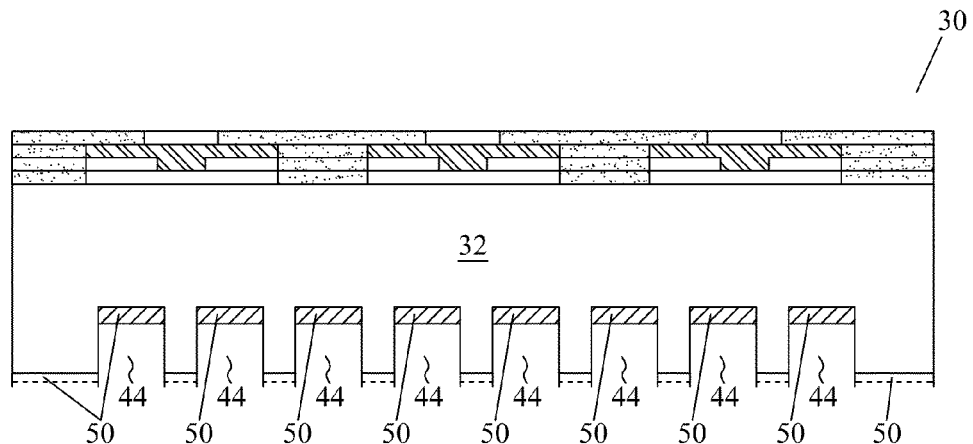
Figure 6B:
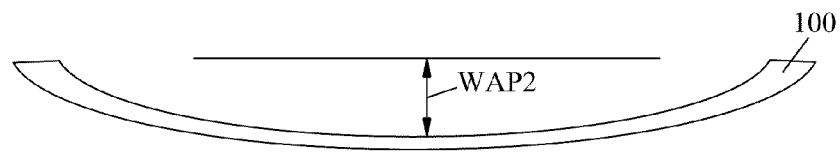

FIGS. 6A through 8B illustrate the repeated photo-resist filling and baking processes. Please note that in actual photo resist application processes, trenches 44 may face up when these process steps are performed. Referring to FIG. 6A, trenches 44 are filled with photo resist 50. It is noted that photo resist 50, either sprayed or spun on, may have first portions (illustrated using dotted lines) directly over the back surface of chip 30, and second portions in trenches 44, and it is expected that the thickness of the second portions of photo resist 50 will be significantly greater than that of the first portions. Accordingly, the first portions of photo resist 50 can be etched, either anisotropically or isotropically, using either dry etch or wet etch. The second portions of photo resist 50, although thinned by the etch, will still have portions remaining in trenches 44. Alternatively, the first portions of photo resist 50 may be removed by first being exposed to light, and then developed, so that only the exposed first portions are removed. In yet other embodiments, other methods such as CMP may be used. The wafer is then baked, for example, using furnace baking. The baking results in the warpage of the wafer to be reduced from warpage WAP1 to WAP2, as is shown in FIG. 6B.

Figure 7A:
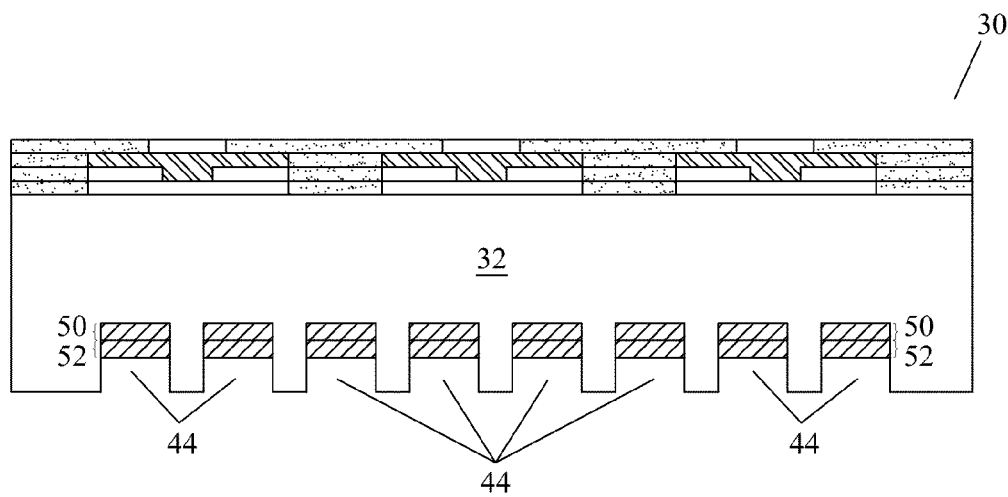
Figure 7B:
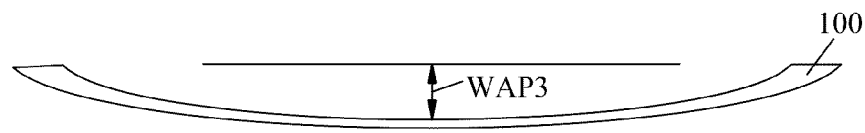
Figure 8A:
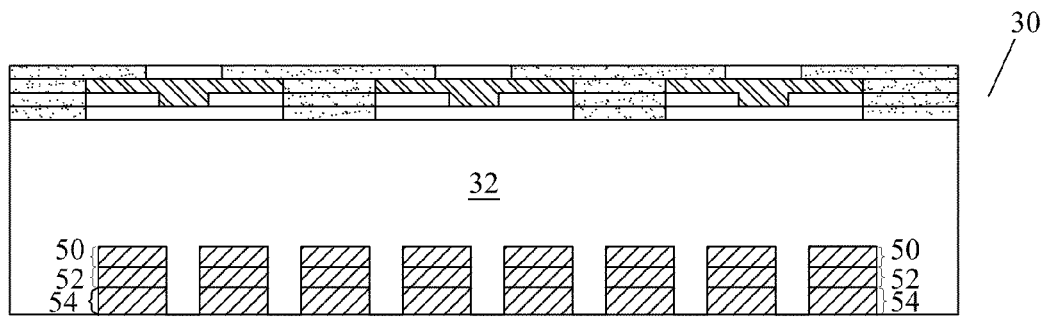
Figure 8B:
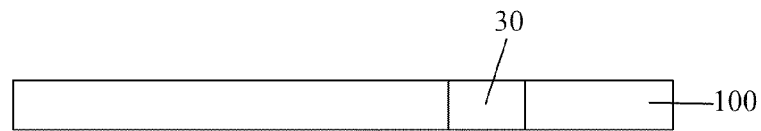

Next, as shown in FIG. 7A, photo resist 52 is filled in trenches 44 and over photo resist 50. The filling processes may be essentially the same as discussed in the preceding paragraphs. A second baking is performed. As a result of the second baking, the warpage of the wafer reduces from WAP2 to WAP3, as is shown in FIG. 7B. Next, photo resist 54 is filled in trenches 44 and baked, as shown in FIG. 8A. Similarly, the filling and the baking of photo resist 54 cause further reduction in warpage. Eventually, as shown in FIG. 8B, the warpage of wafer 100 is substantially eliminated, resulting in a substantially flat wafer 100.

Figure 9A:
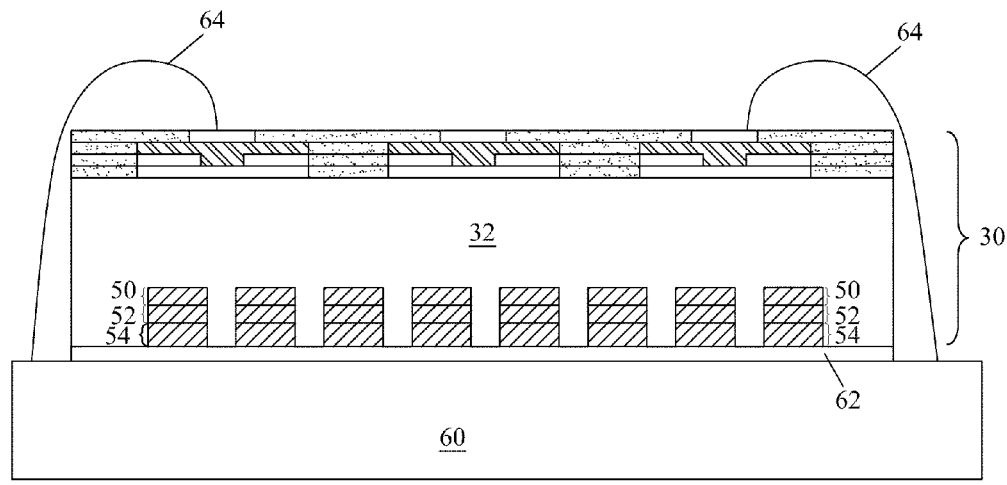
FIGS. 9A and 9B are packages including the embodiments of the present invention.
Figure 9B:
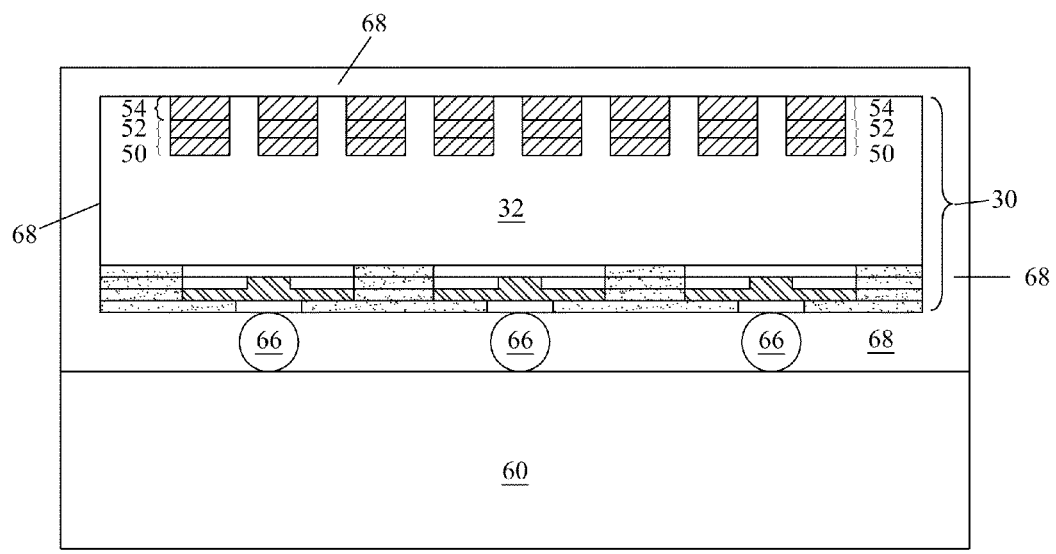

After chip 30 is separated (which may be made using a saw or laser) from wafer 100, photo resists 50, 52, and 54 may remain in trenches 44, and are packaged into the packages, as are shown in FIGS. 9A and 9B. Alternatively, photo resists 50, 52, and 54 may be removed from trenches 44, and may be removed after chip 30 is separated from wafer 100. Throughout the description, chips 30 that are already separated from the respective wafer 100 are referred to as discrete chips. FIG. 9A illustrates an exemplary wire-bonding package, wherein chip 30 is bonded to package substrate 60 through wires 64. Underfill 62 may be filled between the back surface of chip 30 and package substrate 60. FIG. 9B illustrates an exemplary flip-chip package, wherein chip 30 is bonded to package substrate 60 through solder balls 66. Molding compound (or underfill) 68 may be used to protect chip 30 and solder balls 66, wherein molding compound 68 may contact the back surface of chip 30, and may be filled into the space between chip 30 and package substrate 60.

In the above-discussed embodiments, three photo-resist filling and baking processes are used as examples to explain the concept of the embodiments. In alternative embodiments, the multi-step filling process may include only two photo-resist filling and baking processes, or more than three photo-resist filling and baking processes, depending on the value of warpage WAP1 (FIG. 4A) and/or the type of photo resists. Advantageously, by using multi-step filling and baking processes, the thickness of each of the photo resists 50, 52, and 54 is not excessive, and hence bubbles are less likely to be generated in the photo resists. In yet other embodiments, if depth D (FIG. 4A) is small, only one photo resist filling and baking step is used. Further, at the time wafer 100 is substantially flat, and/or at the time the photo-resist filling and baking process is finished, the photo resist may substantially fully fill trenches 44 (FIG. 5A), or only fill trenches 44 partially.

The embodiments of the present invention are not limited to the filling of photo resist. In alternative embodiments, other organic materials such as polyimide, resins, or the like that may contract when cured or annealed/baked may also be used to achieve the warpage compensation effect.

The embodiments of the present invention have several advantageous features. Since the trenches are formed on the backside of the chip, it can be used in situations wherein it is not suitable to form stress-compensation coatings on the top surface of the chip. Further, the patterns of the trenches can be adjusted so that they are spaced apart from existing patterns and or devices that have to be formed on the backside of chip 30, and hence the use of the embodiments of the present invention is not affected by the conditions on the back surfaces of the chips.

Although the present invention and its advantages have been described in detail, it should be understood that various changes, substitutions and alterations can be made herein without departing from the spirit and scope of the invention as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps. In addition, each claim constitutes a separate embodiment, and the combination of various claims and embodiments are within the scope of the invention.

What is claimed is:

1. An integrated circuit structure comprising:
 a discrete chip comprising:
  a substrate comprising a back surface;
  a trench extending from the back surface into the substrate, wherein the trench stops at an intermediate level between the back surface and a front surface of the substrate; and
  an organic material in the trench.

2. The integrated circuit structure of claim 1, wherein the organic material comprises photo resist.

3. The integrated circuit structure of claim 1, wherein the trench comprises a first portion having a first lengthwise direction, and a second portion having a second lengthwise direction, and wherein the first lengthwise direction and the second lengthwise direction are in-plane directions perpendicular to each other.

4. The integrated circuit structure of claim 1, wherein the trench comprises a closed-loop trench ring selected from the group consisting essentially of a substantially square-shaped ring and a circular trench ring.

5. The integrated circuit structure of claim 1, wherein the trench is symmetric to a center of the chip.

6. The integrated circuit structure of claim 1, wherein the substrate is a semiconductor substrate.

7. The integrated circuit structure of claim 1, wherein a portion of the trench is in a dielectric material at the back surface of the discrete chip.

8. The integrated circuit structure of claim 1, wherein a portion of the trench is in a metallic layer at the back surface of the discrete chip.

9. The integrated circuit structure of claim 1 further comprising a package substrate, wherein the discrete chip is mounted on the package substrate.

10. The integrated circuit structure of claim 1 comprising a micro-electro-mechanical system (MEMS) device in the discrete chip.

11. The integrated circuit structure of claim 1, wherein substantially no photo resist is outside of the trench and on the back surface of the discrete chip.

12. The integrated circuit structure of claim 1 further comprising a plurality of trenches filled with the organic material, wherein the trench and the plurality of trenches form trench rings.

13. An integrated circuit structure comprising:
 a chip comprising:
  a front surface;
  a back surface on an opposite side of the front surface;
  a plurality of trenches in the chip and extending from the back surface into the chip; and
  a photo resist filled in the plurality of trenches, wherein the photo resist is not on the back surface of the chip and outside of the plurality of trenches.

14. The integrated circuit structure of claim 13, wherein the photo resist partially fills each of the plurality of trenches.

15. The integrated circuit structure of claim 13, wherein the photo resist substantially fully fills each of the plurality of trenches.

16. The integrated circuit structure of claim 13, wherein the plurality of trenches comprise a trench forming a closed-loop ring.

17. The integrated circuit structure of claim 13 further comprising a package substrate, wherein the chip is mounted on the package substrate.

18. The integrated circuit structure of claim 13, wherein the chip further comprises a semiconductor substrate, wherein the plurality of trenches extends from a back surface of the semiconductor substrate into the semiconductor substrate, and stops at an intermediate level of the semiconductor substrate, and wherein the intermediate level is between a front surface and the back surface of the semiconductor substrate.

19. The integrated circuit structure of claim 18, wherein the chip is a portion of an un-sawed wafer, and wherein substantially no trench is formed in any of scribe lines in the wafer and filled with the photo resist.

20. The integrated circuit structure of claim 13, wherein the chip is a discrete chip.

* * * * *